US009466639B2

(12) United States Patent
Tsukagoshi (10) Patent No.: US 9,466,639 B2
(45) Date of Patent: Oct. 11, 2016

(54) METHOD OF MANUFACTURING SOLID-STATE IMAGING APPARATUS (71) Applicant: CANON KABUSHIKI KAISHA, Tokyo (JP)

(72) Inventor: Yusuke Tsukagoshi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/600,223

(22) Filed: Jan. 20, 2015

(65) Prior Publication Data

US 2015/0236068 A1 Aug. 20, 2015

(30) Foreign Application Priority Data

Feb. 18, 2014 (JP) ................................. 2014-028965

(51) Int. Cl.
*H01L 21/00* (2006.01)
*H01L 27/146* (2006.01)

(52) U.S. Cl.
CPC ... *H01L 27/14685* (2013.01); *H01L 27/14623* (2013.01); *H01L 27/14627* (2013.01); *H01L 27/14629* (2013.01)

(58) Field of Classification Search
None
See application file for complete search history.

(56) References Cited

U.S. PATENT DOCUMENTS

| 6,221,687 | B1 * | 4/2001 | Abramovich | ..... H01L 27/14601 438/69 |
| 2006/0054946 | A1 * | 3/2006 | Baek | ................ H01L 27/14685 257/292 |
| 2008/0042177 | A1 * | 2/2008 | Park | .................. H01L 27/14625 257/294 |
| 2012/0261731 | A1 * | 10/2012 | Yu | ..................... H01L 27/14621 257/292 |

FOREIGN PATENT DOCUMENTS

| JP | 2003-204050 A | 7/2003 |
| JP | 2006-120845 A | 5/2006 |
| JP | 2006-351855 A | 12/2006 |

* cited by examiner

*Primary Examiner* — Sonya D McCall Shepard
(74) *Attorney, Agent, or Firm* — Fitzpatrick, Cella, Harper & Scinto (57) ABSTRACT

A method of manufacturing a solid-state imaging apparatus, comprising preparing a substrate on which photoelectric conversion portions are arranged, forming inner lenses corresponding to the photoelectric conversion portions, and forming microlenses corresponding to the photoelectric conversion portions, wherein the forming inner lenses includes forming, on the substrate, a dielectric film for forming the plurality of inner lenses, and etching second portions of the dielectric film around first portions serving as central portions of the inner lenses while leaving upper faces of the first portions, so as to form curved faces or inclined faces connected to the upper faces.

12 Claims, 9 Drawing Sheets

METHOD OF MANUFACTURING SOLID-STATE IMAGING APPARATUS

BACKGROUND OF THE INVENTION

1. Field of the Invention

The present invention relates to a method of manufacturing a solid-state imaging apparatus.

2. Description of the Related Art

A solid-state imaging apparatus includes a plurality of pixels. In correspondence with each pixel, the solid-state imaging apparatus includes a photoelectric conversion portion formed on a substrate, and a microlens arranged above the photoelectric conversion portion. The solid-state imaging apparatus can further include an inner lens interposed between the photoelectric conversion portion and the microlens. The inner lens refracts light entering the peripheral portion of the microlens toward the photoelectric conversion portion. This structure improves the light sensitivity in each pixel.

If inner lenses have variations of the lens height (distance from the bottom face to top of the inner lens) between pixels, a light sensitivity difference is generated between the pixels. For example, this may lead to poor image quality such as color non-uniformity arising from a difference between signal values from respective pixels even when uniform light enters the solid-state imaging apparatus.

SUMMARY OF THE INVENTION

The present invention provides a technique advantageous for reducing the light sensitivity difference between pixels while improving the light sensitivity in each pixel.

One of the aspects of the present invention provides a method of manufacturing a solid-state imaging apparatus, comprising a first step of preparing a substrate on which a plurality of photoelectric conversion portions are arranged, a second step of forming, on the substrate, a plurality of inner lenses corresponding to the plurality of photoelectric conversion portions, and a third step of forming, on the plurality of inner lenses, a plurality of microlenses corresponding to the plurality of photoelectric conversion portions, wherein the second step includes a step of forming, on the substrate, a dielectric film for forming the plurality of inner lenses, and a step of, while leaving, of the dielectric film, upper faces of first portions serving as central portions of the plurality of inner lenses, forming, around the upper faces of the dielectric film, curved faces or inclined faces connected to the upper faces by etching second portions around the first portions.

Further features of the present invention will become apparent from the following description of exemplary embodiments with reference to the attached drawings.

DESCRIPTION OF THE EMBODIMENTS

An example of the arrangement of a solid-state imaging apparatus I and a method of manufacturing the same will be described as a preferred embodiment of the present invention with reference to FIGS. 1 to 7B.

(1. Example of Arrangement of Solid-State Imaging Apparatus I)

(1-1. Example of Overall Arrangement of Solid-State Imaging Apparatus I)

Figure 1:
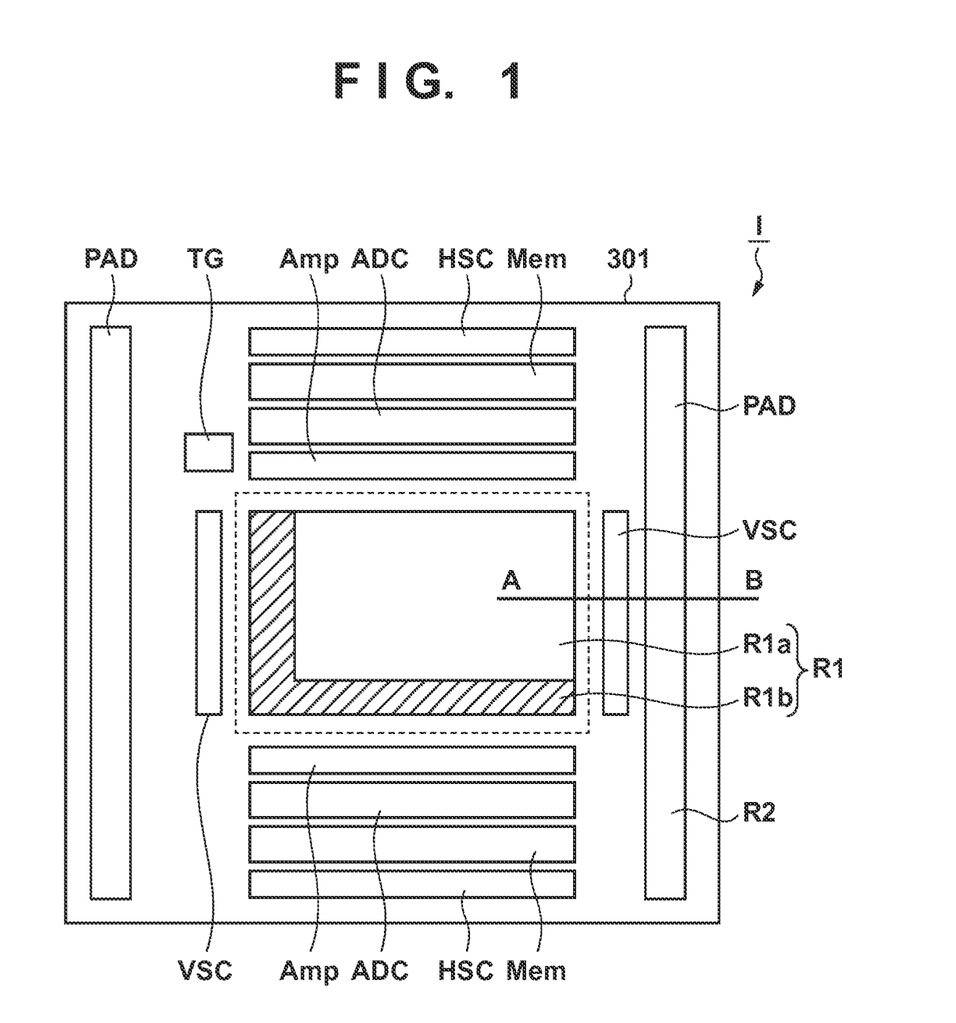
FIG. 1 is a view for explaining an example of the overall arrangement of a solid-state imaging apparatus.

FIG. 1 is a schematic view for explaining an example of the overall arrangement of the solid-state imaging apparatus I. The solid-state imaging apparatus I includes an imaging region R1 and a peripheral region R2.

In the imaging region R1, for example, a plurality of pixels are arrayed to form a pixel array. The imaging region R1 may include a light-receiving region Ria and a light-shielding region Rib. In the light-receiving region Ria, pixels for reading out a signal based on a received light amount are arranged. The signal based on the received light amount may be used not only for imaging but also for focus detection and the like. In the light-shielding region Rib, a light-shielding member for cutting off incident light, and pixels for reading out a signal of a noise component are arranged.

In the peripheral region R2, processors are arranged. The processors include a driving unit for driving each pixel of the imaging region R1, and a signal processor for processing a signal read out from each pixel of the imaging region R1. The processors are, for example, vertical scanning circuits VSC, amplifiers Amp, analog-to-digital converters ADC (to be simply referred to as "A/D converters ADC" hereinafter), memories Mem, horizontal scanning circuits HSC, a timing generator TG, and pad groups PAD.

Each pixel suffices to take a well-known circuit configuration. Each pixel is formed by, for example, a photoelectric conversion portion such as a photodiode, and a plurality of MOS transistors for reading out, as a pixel signal, an electric signal based on charges that are generated in the photoelectric conversion portion in accordance with an incident light amount. It is only necessary that the photoelectric conversion portions and the plurality of MOS transistors are formed on a substrate made of a semiconductor such as silicon by using a well-known semiconductor manufacturing process.

The plurality of MOS transistors include, for example, a transfer transistor, an amplifier transistor, and a reset transistor. The transfer transistor transfers charges in the photoelectric conversion portion to a floating diffusion serving as the drain region of the transfer transistor in response to a control signal supplied to the gate. The amplifier transistor has a gate connected to the floating diffusion, and outputs a current of an amount corresponding to the amount of charges transferred to the floating diffusion. The reset transistor resets the potential of the floating diffusion in response to a control signal supplied to the gate. The plurality of MOS transistors may further include a selection transistor. The selection transistor outputs, as a pixel signal, a signal of a level corresponding to the current amount of the amplifier transistor in response to a control signal supplied to the gate.

The vertical scanning circuits VSC output the above-mentioned control signals to the respective pixels, and the respective pixels are driven in response to the control signals and input pixel signals to the amplifiers Amp. The amplifiers Amp are arranged in correspondence with the respective columns of the pixel array, and amplify pixel signals and output them to the A/D converters ADC. The A/D converters ADC are arranged in correspondence with the respective columns of the pixel array, and A/D-convert signals from the amplifiers Amp. The pixel signals are then processed as digital signals. The memories Mem are arranged in correspondence with the respective columns of the pixel array, and include, for example, a memory for holding a pixel signal and a memory for holding a signal from the pixel after resetting. The horizontal scanning circuits HSC output signals for performing horizontal transferring of pixel signals read out from the respective columns. In this manner, the pixel signals are sequentially output to the outside. Based on, for example, an external clock signal, the timing generator TG outputs, to the vertical scanning circuits VSC and the horizontal scanning circuits HSC, control signals for reading out a pixel signal. The respective electrode pads of the pad group PAD are electrode pads for reading out a pixel signal, and include an electrode pad for inputting a control signal and an electrode pad for supplying a power supply voltage, in addition to an electrode pad for outputting a readout pixel signal.

(1-2. Example of Sectional Structure of Solid-State Imaging Apparatus I)

Figure 2:
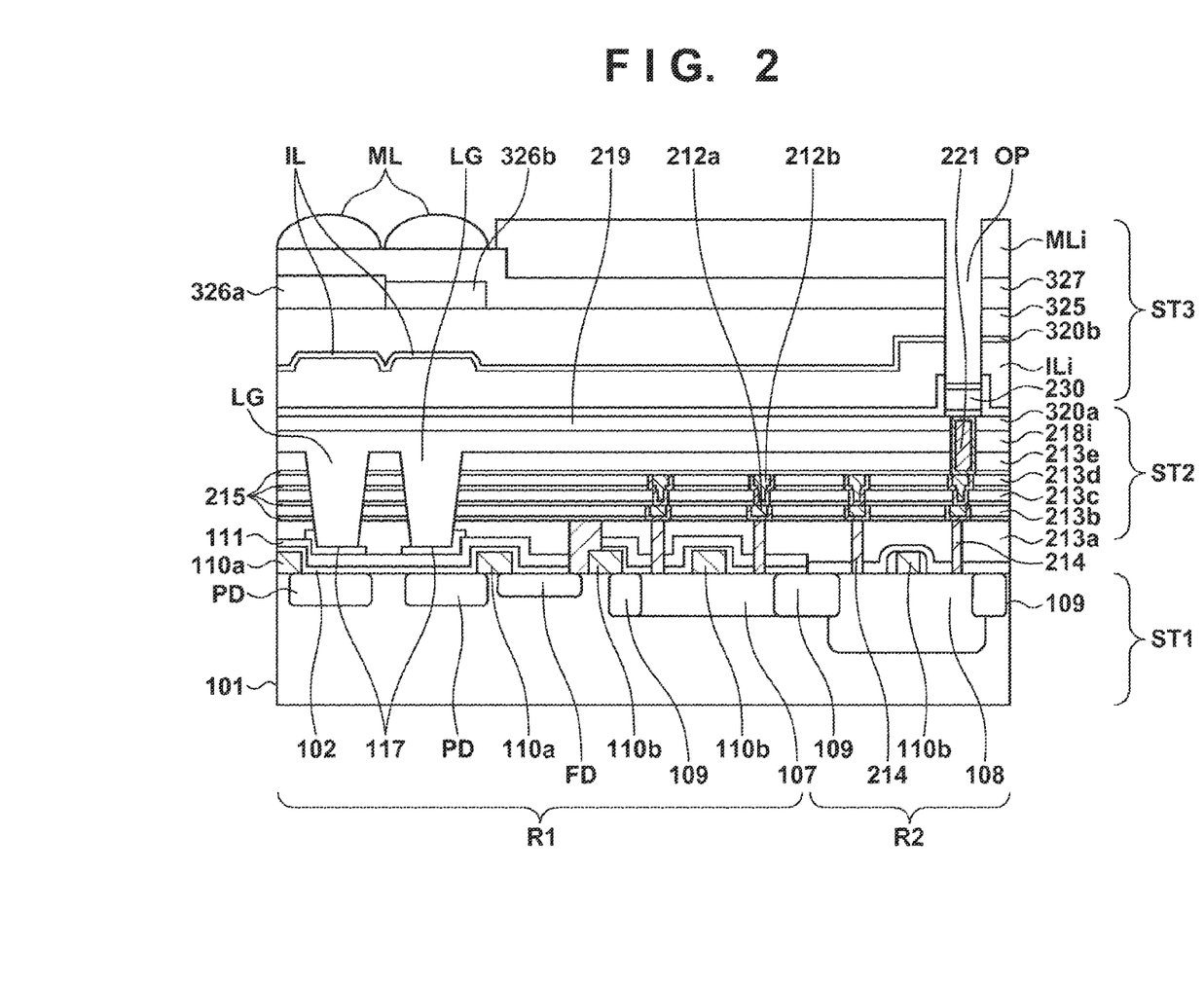
FIG. 2 is a view for explaining an example of the sectional structure of the solid-state imaging apparatus.

FIG. 2 is a schematic view showing a sectional structure taken along a cut line A-B in FIG. 1. The solid-state imaging apparatus I has a first structure ST1, a second structure ST2, and a third structure ST3.

The first structure ST1 is mainly a semiconductor circuit portion in which the above-described photoelectric conversion portions and processors are formed. The first structure ST1 includes a substrate 101, elements (for example, photoelectric conversion portions PD, a floating diffusion FD, and transistors) formed on the substrate 101, and element isolation portions 109.

More specifically, the substrate 101 is partitioned by the element isolation portions 109. In the regions of the partitioned substrate 101, the photoelectric conversion portions PD, the floating diffusion FD, and respective transistors are formed. A well 107 and a well 108 are diffusion regions for forming MOS transistors constituting the above-mentioned processors. Gate electrodes 110a are the gate electrodes of the transfer transistors, and gate electrodes 110b are the gate electrodes of the amplifier transistor and respective transistors for signal processing. A protective film 111 is arranged on an insulating film 102 on these elements. Etching stoppers 117 are further arranged immediately above the photoelectric conversion portions PD, as needed.

The second structure ST2 is a structure mainly including an insulating member and a wiring portion formed in the insulating member. The insulating member includes interlayer insulation films 213 (for example, 213a). The wiring portion includes wiring patterns 212 (for example, 212a) arranged on respective wiring layers, and contact plugs 214. In this example, a case will be explained, in which light guides LG for guiding incident light to the photoelectric conversion portions PD, and the like are further formed in the second structure ST2.

More specifically, the interlayer insulation films 213, that is, 213a to 213e, and an interlayer insulation film 219 made of an insulating material such as silicon oxide, and the wiring patterns 212a and 212b made of a metal material such as copper or aluminum are arranged on the first structure ST1. Metal diffusion preventing films 215 may be interposed between the respective interlayer insulation films 213. The contact plugs 214 for electrically connecting respective elements on the substrate 101 and the wiring patterns 212 are formed in the interlayer insulation film 213a. Each light guide LG is arranged above the photoelectric conversion portion PD, and is formed by burying a translucent material having a large refractive index, such as silicon nitride, in an opening formed in the interlayer insulation films 213a to 213e. The interlayer insulation film 219 is arranged on the light guides LG. An electrode 230 for forming an electrical connection with the outside is arranged on the interlayer insulation film 219. The electrode 230 is electrically connected to the wiring patterns 212 via a plug 221.

The third structure ST3 is a portion that mainly forms an optical system for condensing incident light to the solid-state imaging apparatus I. The third structure ST3 includes optical elements such as inner lenses IL, color filters 326 (for example, 326a), and microlenses ML. The correspondence between each optical element and the photoelectric conversion portion is not limited to one-to-one, and two photoelectric conversion portions may correspond to one optical element.

More specifically, the inner lens IL is arranged on an antireflection film 320a on the second structure ST2. The inner lens IL is obtained by shaping at least part of an inner lens member ILi formed on the antireflection film 320a. The top of the inner lens IL is formed to be flat, details of which will be described later.

An antireflection film 320b is arranged on the inner lens IL. The color filters 326a and 326b are arranged on a planarizing layer 325 at portions of the antireflection film 320b that correspond to the photoelectric conversion portions PD. The color filters 326a and 326b transmit light of a predetermined wavelength and are made of, for example, translucent materials of red, green, and blue. The microlenses ML are arranged on a planarizing layer 327 on the color filters 326a and 326b. The microlens ML is obtained by shaping at least part of a microlens member MLi formed on the planarizing layer 327.

In the peripheral region R2, an opening OP that exposes the electrode 230 is formed to extend from the upper face of the microlens member MLi to the upper face of the antireflection film 320a.

(2. Example of Method of Manufacturing Solid-State Imaging Apparatus I)

An example of a method of manufacturing the solid-state imaging apparatus I will be described with reference to FIGS. 3A to 3F. The solid-state imaging apparatus I can be manufactured using a well-known semiconductor manufacturing technique.

Figure 3A:
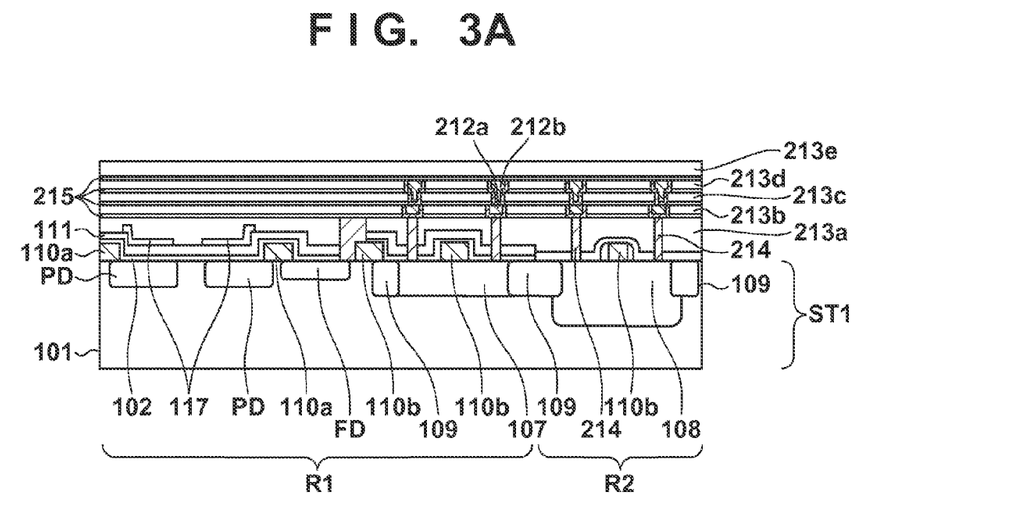
FIGS. 3A to 3F are views for explaining an example of a method of manufacturing the solid-state imaging apparatus.

First, as exemplified in FIG. 3A, the above-described first structure ST1 is prepared, and a multilayered structure in which interlayer insulation films and wiring layers are alternately arranged is formed on the first structure ST1. More specifically, first, for example, element isolation portions 109 for electrically separating elements to be formed later are formed in a p-type substrate 101 made of a semiconductor such as silicon. The element isolation portions 109 are formed by, for example, STI (Shallow Trench Isolation) or LOCOS (LOCal Oxidation of Silicon).

Thereafter, wells 107 and 108, photoelectric conversion portions PD, a floating diffusion FD, and respective transistors are formed by ion implantation and annealing in the respective regions of the substrate 101 partitioned by the element isolation portions 109. The photoelectric conversion portion PD and the floating diffusion FD are, for example, of the n-type. The well 107 and the well 108 are p- and n-type diffusion regions for forming MOS transistors constituting a signal processor configured to process a signal read out from the pixel.

Gate electrodes 110a and 110b are formed on an insulating film on the wells 107 and 108. Diffusion regions (not shown) serving as a source and drain are formed on the two sides of each gate electrode, forming each transistor. The gate electrodes 110a are the gate electrodes of transfer transistors. The gate electrodes 110b are the gate electrodes of amplifier transistors and respective transistors for signal processing.

If necessary, a protective film 111 may be formed on, for example, an insulating film 102 on the substrate 101 on which the respective transistors are formed. The protective film 111 may be made of, for example, silicon nitride, or constituted by a plurality of layers using silicon nitride and silicon oxide. The protective film 111 protects the photoelectric conversion portion PD from the influence of respective subsequent steps. The protective film 111 is preferably configured to have a function of preventing reflection of light to the photoelectric conversion portion PD and a function of preventing metal diffusion caused by a silicidation step.

If necessary, etching stoppers 117 may be formed to cover portions of the protective film 111 immediately above the photoelectric conversion portions PD. The etching stoppers 117 are used in an etching step that is performed later in order to form openings 216. By these steps, the first structure ST1 is obtained.

After that, a multilayered structure in which interlayer insulation films and wiring layers are alternately arranged is formed on the first structure ST1. For example, interlayer insulation films 213, that is, 213a to 213e made of silicon oxide or the like are formed. Wiring patterns 212 and contact plugs 214 are formed in the respective interlayer insulation films 213. For example, contact plugs 214 for electrically connecting the respective diffusion regions of the substrate 101 and wiring patterns are formed in the first interlayer insulation film 213a. For the contact plug 214, a conductive material such as tungsten is used. A wiring pattern 212a is formed in the second interlayer insulation film 213b by, for example, a damascene method. A wiring pattern 212b is formed in the third and fourth interlayer insulation films 213c and 213d. For the wiring patterns 212, a conductive material such as copper or aluminum is used. When forming a multilayered structure, planarization processing of planarizing the upper face of an interlayer insulation film, such as chemical mechanical polishing (to be referred to as CMP hereinafter) or etch-back may be performed on at least one interlayer insulation film.

If necessary, for example, metal diffusion preventing films 215 are formed between the respective interlayer insulation films 213. For the metal diffusion preventing film 215, for example, silicon nitride is used. The metal diffusion preventing film 215 can function as even an etching stopper when an opening for forming each wiring pattern 212 is formed by etching in each interlayer insulation film 213.

Figure 3B:
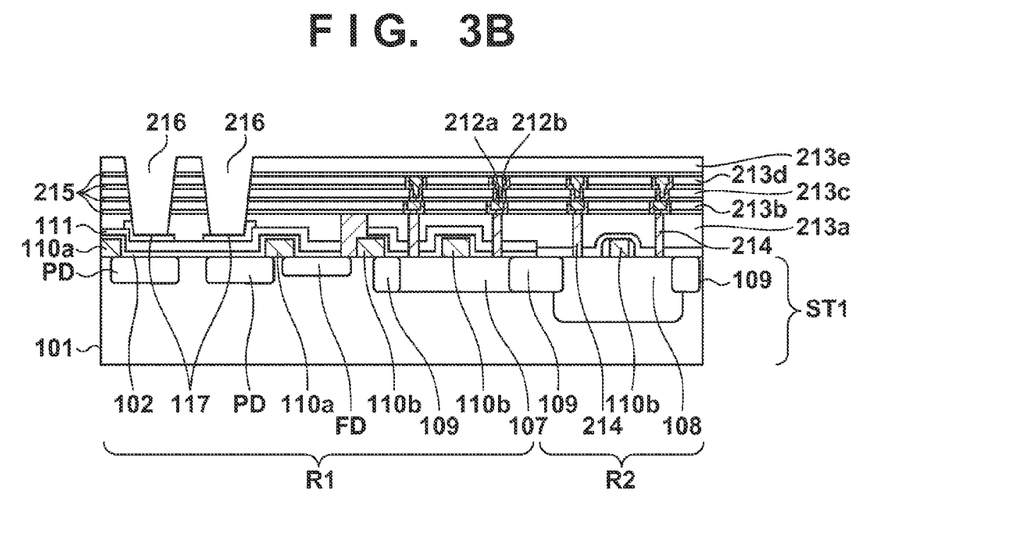

Then, as exemplified in FIG. 3B, light guides LG are formed in the multilayered structure. More specifically, portions, above the photoelectric conversion portions PD, of the insulating member including the interlayer insulation films 213 and the diffusion preventing films 215 are removed, forming openings 216. The opening 216 is formed immediately above the photoelectric conversion portion PD so as to form later the light guide LG for guiding incident light to the photoelectric conversion portion PD. The outer shape of the opening 216 when viewed from the top may be circular, polygonal, or rectangular.

In the step of forming the opening 216, part of the insulating member (including the interlayer insulation films 213 and the diffusion preventing films 215) is removed to expose the etching stopper 117. However, the etching stopper 117 may not be exposed. For the etching stopper 117, a material lower in etching rate than the interlayer insulation film 213a is used. For example, silicon oxide may be used for the interlayer insulation film 213a, and silicon nitride or silicon oxynitride may be used for the etching stopper 117.

Also, in the step of forming the opening 216, etching may be performed by a plurality of times under different etching conditions. Here, a case in which the opening 216 is formed in the imaging region R1 is exemplified. If necessary, the opening 216 is formed even in the peripheral region R2.

Figure 3C:
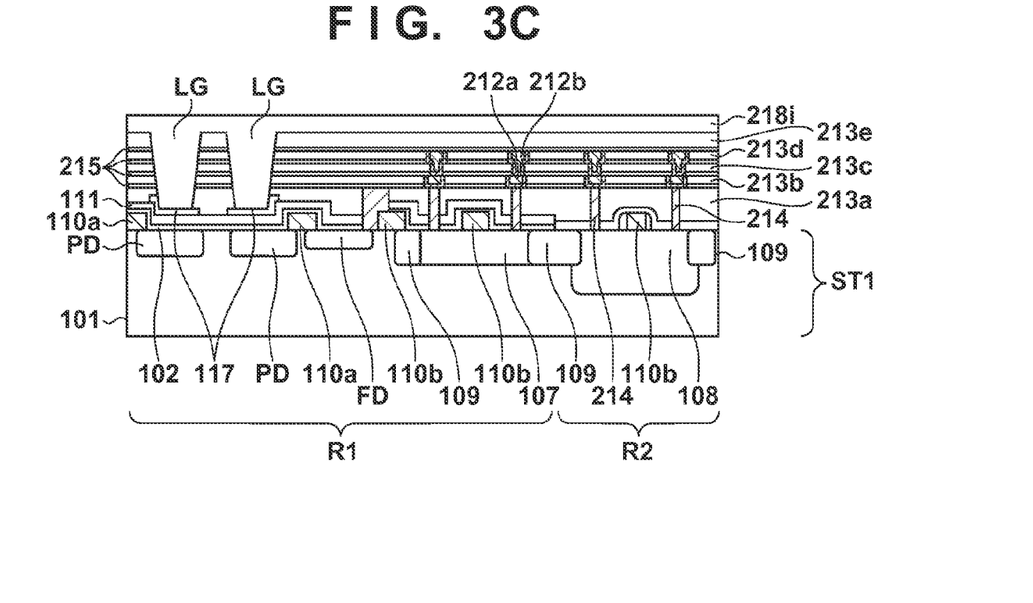

Thereafter, as exemplified in FIG. 3C, the openings 216 are filled with a translucent material, forming light guides LG. This step is performed by a deposition method such as CVD. As the translucent material, for example, silicon nitride larger in refractive index than the interlayer insulation film 213 is used. This step may be performed by a plurality of times of deposition step under different conditions. For example, a member 218i of the translucent material may be first deposited under a condition considering adhesion with the etching stopper 117, the interlayer insulation films 213, and the like, and then deposited under a condition in which priority is given to the formation speed, or a different material may be used midway. Alternatively, the light guides LG may be formed by forming an organic material by a coating method.

Note that the member 218i of the translucent material is formed on the interlayer insulation film 213e. It is therefore preferable to planarize the upper face of the member 218i from the imaging region R1 to the peripheral region R2 by planarization processing based on CMP. Alternatively, the upper face of the member 218i may be planarized while the member 218i is removed to expose the upper face of the interlayer insulation film 213e.

Figure 3D:
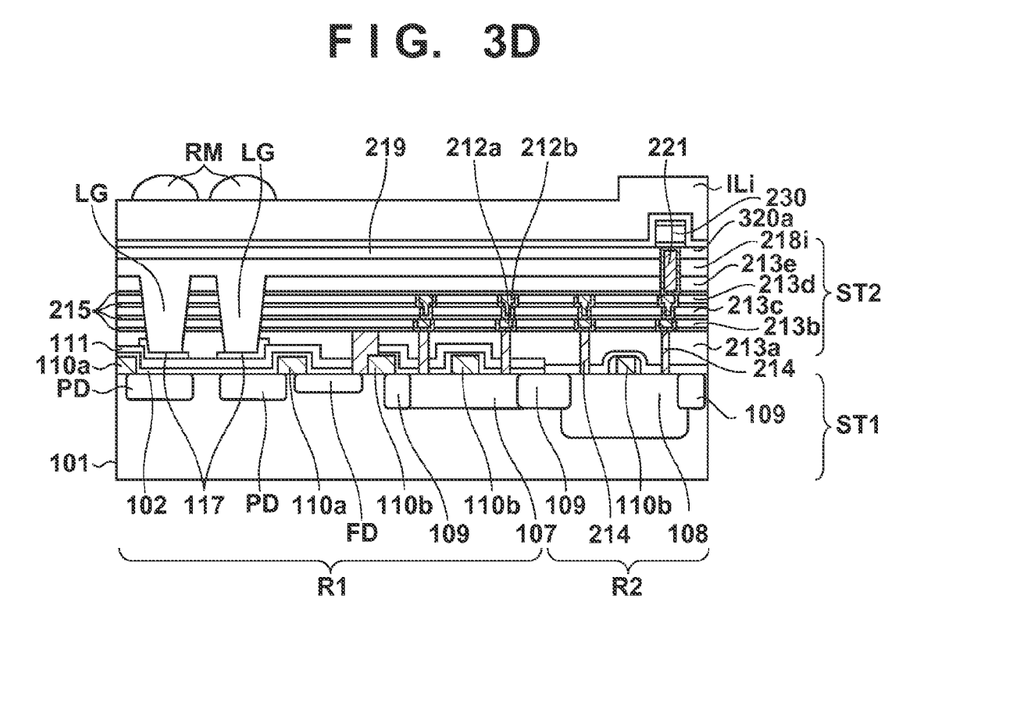

As exemplified in FIG. 3D, an interlayer insulation film 219 is formed on the structure obtained by the step of FIG. 3C. A plug 221 and an electrode 230 are formed in the interlayer insulation films 213e and 219 and the member 218i, and are electrically connected to the wiring pattern 212b. By these steps, the second structure ST2 is obtained.

Then, an antireflection film 320a is formed to cover the electrode 230 and the interlayer insulation film 219, and an inner lens member ILi is formed on the antireflection film 320a. The inner lens member ILi is made of a dielectric material that is a large-refractive-index translucent material, such as silicon nitride. The inner lens member ILi is a dielectric film deposited by chemical vapor deposition (to be referred to as CVD hereinafter), high-density plasma CVD, or the like. Note that the inner lens member ILi may be a dielectric film formed by another method such as coating.

Further, a resist pattern RM is formed at portions of the inner lens member ILi that correspond to the photoelectric conversion portions PD. The resist pattern RM is obtained by shaping, into a lens shape, a resist member (to be referred to as a "resist member RMi") formed on the inner lens member ILi. More specifically, for example, the resist member RMi is made of a thermoplastic material. After the resist member RMi is patterned using a lithography technique, the patterned resist member RMi is shaped into the lens shape by heating (reflow method). The shaping may be performed by exposing and developing the resist member RMi made of a photosensitive material. This exposure can be performed using a multi-tone photomask.

Figure 3E:
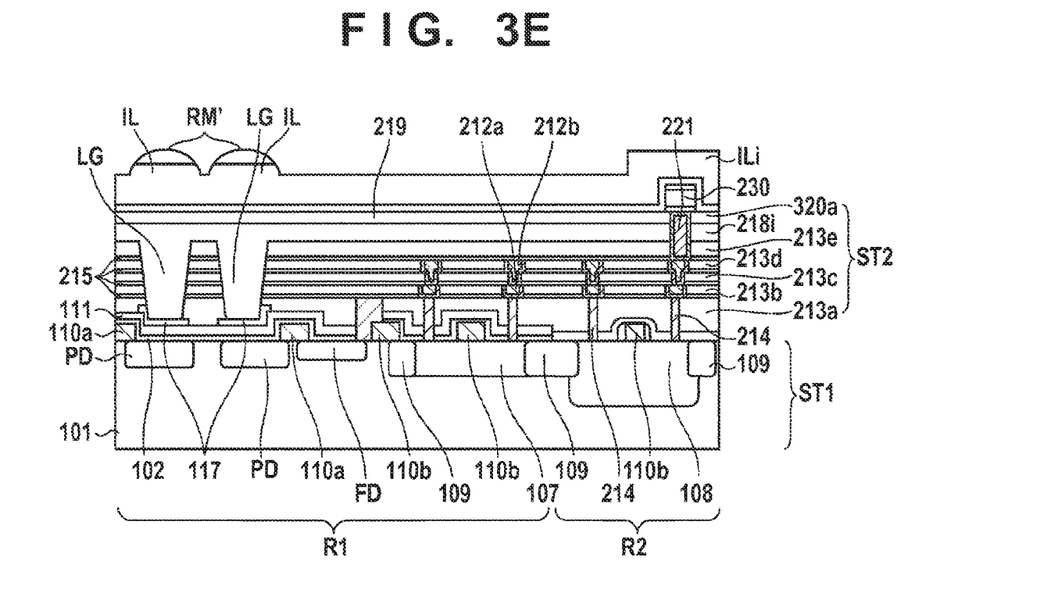

As exemplified in FIG. 3E, the resist pattern RM is etched to etch the inner lens member ILi. At this time, the etching processing ends so as to leave a part RM' of the resist pattern RM. In other words, in this step, part of the shape of the resist pattern RM (shape of the peripheral portion of the lens shape) is transferred to the inner lens member ILi. Of the upper face of the inner lens member ILi, a portion that is the central portion of the lens shape and at which the shape of the resist pattern RM has not been transferred remains without being processed. That is, part of the upper face of the dielectric film serving as the inner lens member ILi is maintained without being processed. At this time, the maintained part of the upper face is an upper face obtained when the dielectric film is deposited. As a result, inner lenses IL each having a flat upper face are formed. Note that "flat" includes the range of variations at the time of depositing the dielectric film and variations of planarization processing of the interlayer insulation film and the like. In this etching step, the etching rate of the resist pattern RM and the etching rate of the inner lens member ILi may be equal to each other or different from each other.

Figure 3F:
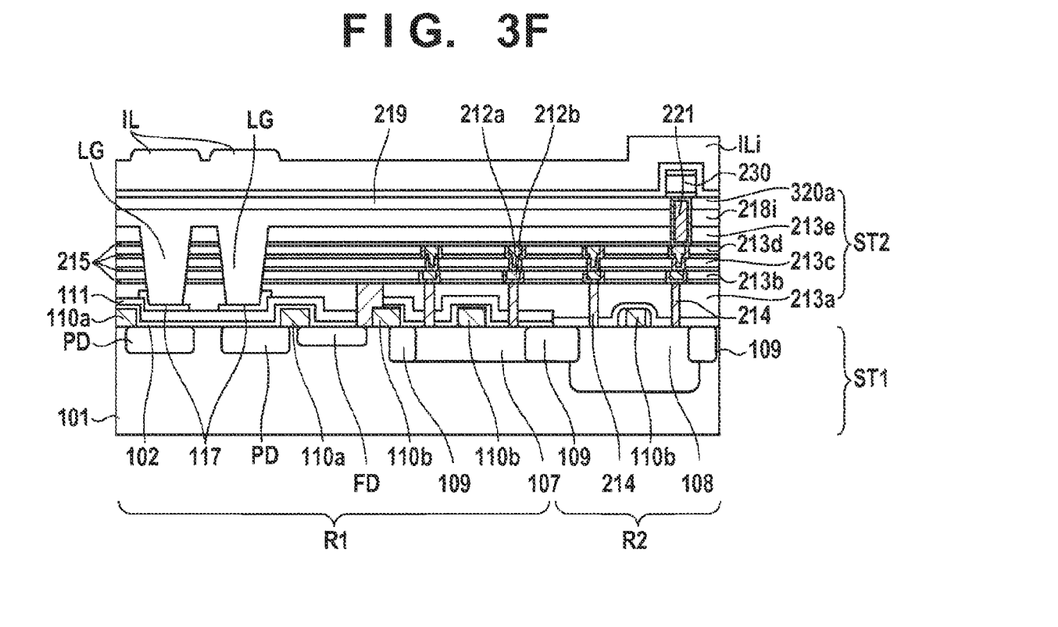

As exemplified in FIG. 3F, the remaining part RM' is removed by, for example, asking, thereby obtaining inner lenses IL each having a flat upper face. The height of the upper face of the inner lens IL formed in this fashion is substantially equal to the height of the upper face of the inner lens member ILi at the time of formation (at the time of the step of FIG. 3D).

After that, an antireflection film 320b is formed to cover the structure obtained by the step of FIG. 3F, and color filters 326 (for example, 326a) are formed on a planarizing layer 325 on the antireflection film 320b. Then, microlenses ML are formed on a planarizing layer 327 on the color filters 326. It is only necessary to form the microlens ML by transferring the shape of a lens-shaped resist pattern to a microlens member MLi formed on the planarizing layer 327. The microlens ML may be formed into an arcuate or hilly lens shape, or its top may be formed to be flat, similar to the inner lens IL. By these steps, the third structure ST3 is obtained. In this way, the above-described structure in FIG. 2 is obtained.

Note that each layer, each film, or each member described above may be formed from a single layer, or two or more layers. After each layer, each film, or each member is formed, planarization processing such as CMP processing may be performed, as needed.

The method of manufacturing the solid-state imaging apparatus I is not limited to the above method, and the solid-state imaging apparatus I can also be manufactured by another well-known manufacturing process. For example, as another method of forming the inner lens IL, a top which should be flat may be covered with a resist pattern, and a portion around the top may be half-etched (that is, a recessed shape may be formed between adjacent pixels) to form the inner lens IL.

(3. Inner Lens with Flat Top)

Figure 4:
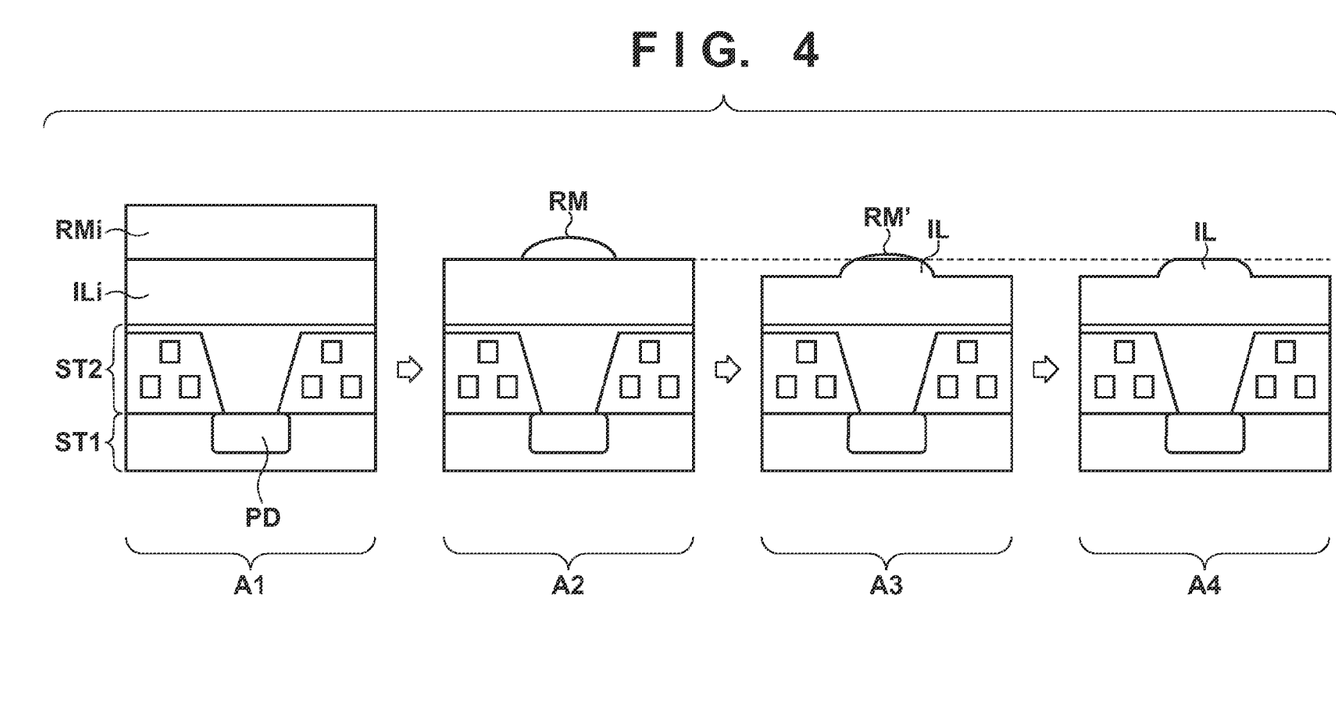
FIG. 4 is a view for explaining an example of an inner lens forming method.

Effects and the like obtained by the flat top of the inner lens will be described with reference to FIGS. 4A1 to 7B. FIGS. 4A1 to 4A4 are schematic views showing an example of a method of forming the inner lens IL. Here, the structures ST1 and ST2 are simplified for descriptive convenience.

In the step A1 shown in FIG. 4, an inner lens member ILi is formed on the second structure ST2, and a resist member RMi is formed on the inner lens member ILi. In the step A2 shown in FIG. 4, the resist member RMi is shaped into a lens shape, forming a resist pattern RM. In the step A3 shown in FIG. 4, the resist pattern RM obtained by the step A2 is etched and the inner lens member ILi is etched. This etching ends so as to leave a part RM' of the resist pattern RM. In the step A4 shown in FIG. 4, the remaining part RM' is removed, obtaining an inner lens IL having a flat upper face.

Figure 5:
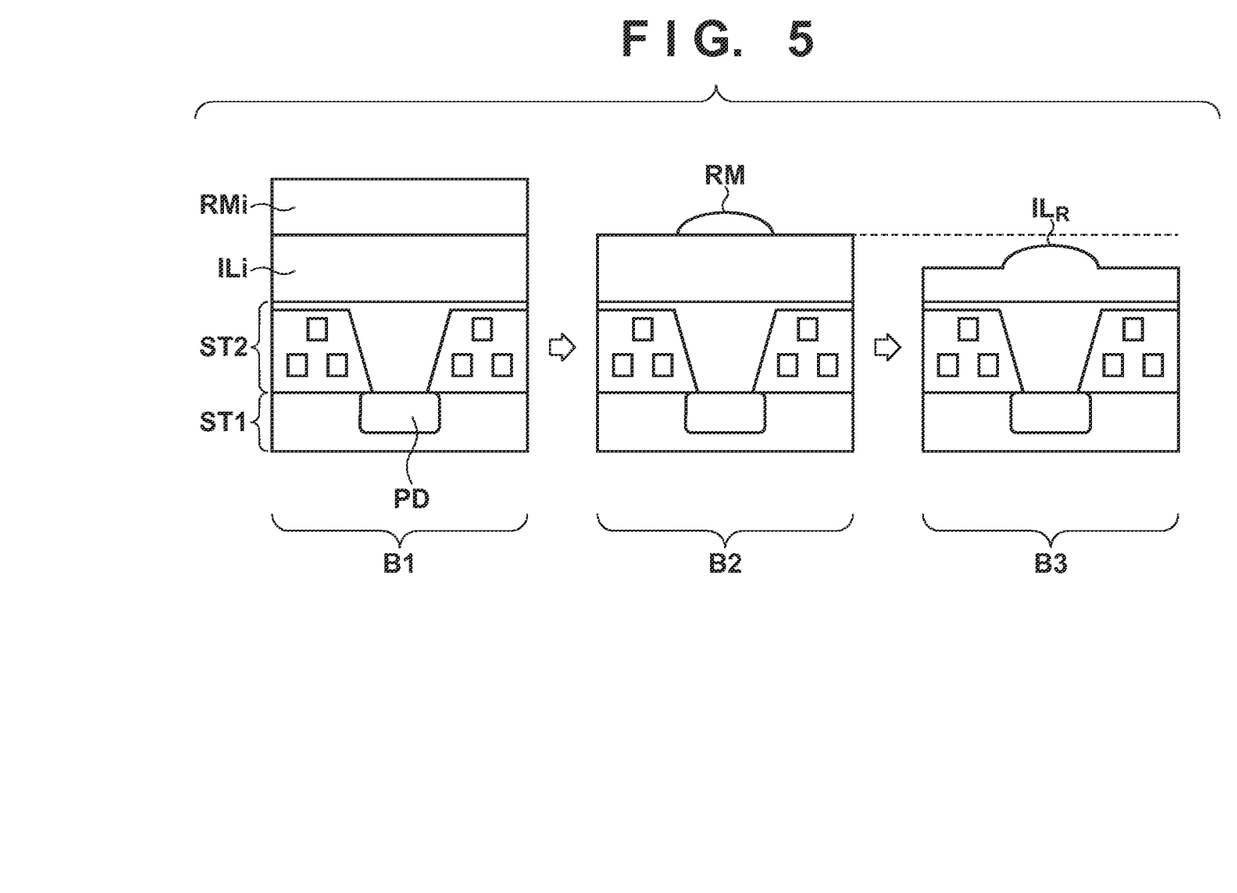
FIG. 5 is a view for explaining a comparative example of the inner lens forming method.

FIG. 5 shows a method of forming an inner lens $IL_R$ as a comparative example. The steps B1 and B2 shown in FIG. 5 are the same as the steps A1 and A2 shown in FIG. 4. This comparative example is different from the step A3 shown in FIG. 4 in that the entire resist pattern RM is etched to transfer the shape of the resist pattern RM to the inner lens member ILi, thereby forming the inner lens $IL_R$, as shown in the step B3 shown in FIG. 5. Hence, the inner lens $IL_R$ has a curved face from the periphery to the top.

Figure 6A:
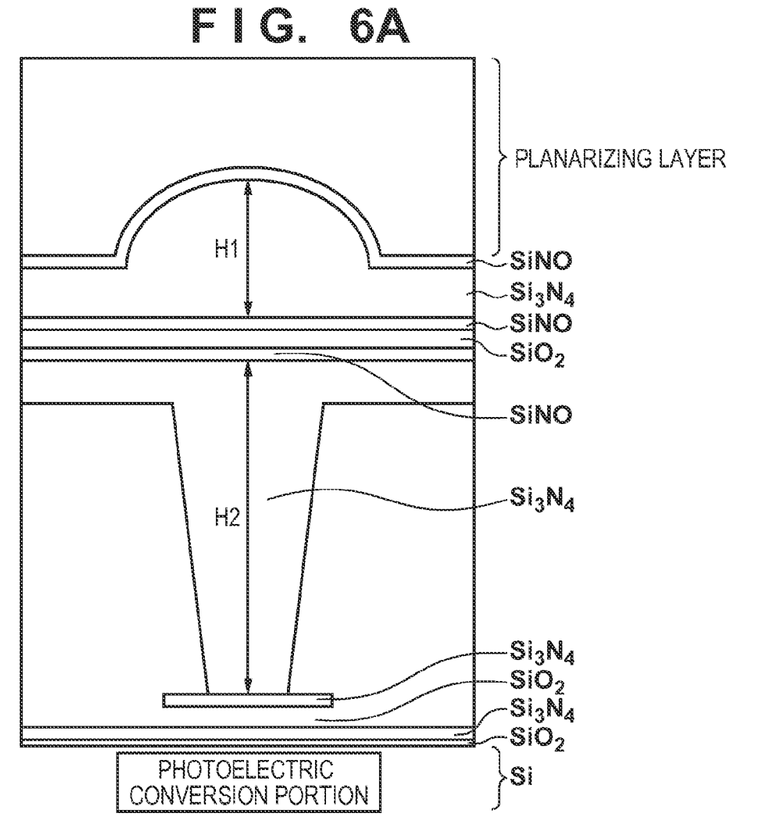
FIGS. 6A and 6B are views for explaining the dependence of the RGB light sensitivity ratio variation on the inner lens height.
Figure 6B:
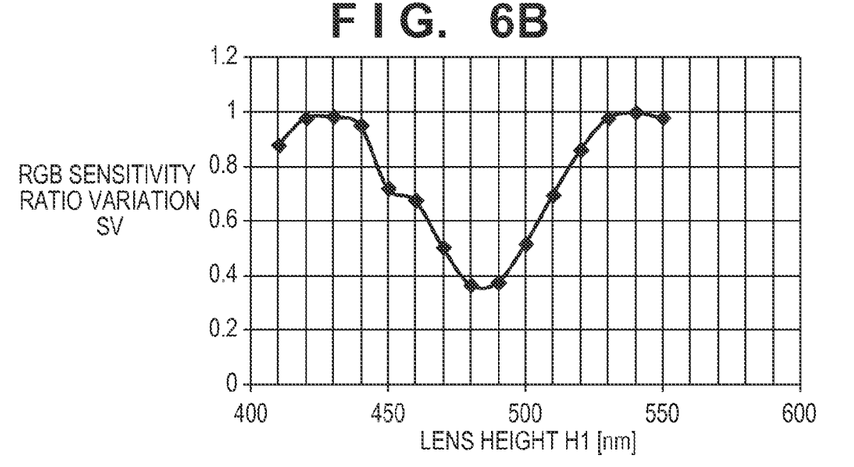

FIGS. 6A and 6B are views for explaining the dependence of the RGB light sensitivity ratio variation of the solid-state imaging apparatus on the lens height of the inner lens. The RGB light sensitivity ratio variation is an index indicating the variation of the light sensitivity ratio between pixels that detect one of red light (R), green light (G), and blue light (B). In this specification, the RGB light sensitivity ratio variation is explained based on a given evaluation method on the premise of a pixel array complying with the Bayer array. However, the light sensitivity difference between pixels may be evaluated by another evaluation method.

FIG. 6A is a schematic view showing the structure of a unit pixel. An inner lens illustrated here complies with the comparative example (inner lens $IL_R$ having a curved face from the periphery to the top). H1 is the lens height (distance from the bottom face to the top) of the inner lens $IL_R$, and H2 is the height (distance from the lower face to upper face of the light guide LG) of the light guide LG. FIG. 6B is a graph plotting the dependence of the RGB light sensitivity ratio variation on the lens height H1.

The transmittances of light entering the inner lens $IL_R$ up to the photoelectric conversion portion PD in the structure of FIG. 6A are as follows:

Tr: transmittance of red light (wavelength: 630 nm)
Tg: transmittance of green light (wavelength: 550 nm)
Tb: transmittance of blue light (wavelength: 450 nm)

These transmittances are obtained by measuring the respective pixels of the pixel array complying with the Bayer array. In addition, $(Tr/Tg)_{MAX}$: maximum value of Tr/Tg
$(Tr/Tg)_{MIN}$: minimum value of Tr/Tg
$(Tb/Tg)_{MAX}$: maximum value of Tb/Tg
$(Tb/Tg)_{MIN}$: minimum value of Tb/Tg By using these signs, this evaluation method defines the RGB light sensitivity ratio variation as:

$$SV \equiv \{((Tr/Tg)_{MAX}/(Tr/Tg)_{MIN}-1)^2+((Tb/Tg)_{MAX}/(Tb/Tg)_{MIN}-1)^2\}^{1/2}$$

This definition represents that as the RGB light sensitivity ratio variation SV is larger, the light sensitivity variation amount between pixels of R, G, and B colors is larger, and as the RGB light sensitivity ratio variation SV is smaller, the light sensitivity variation amount between pixels of R, G, and B colors is smaller.

In calculation based on the above equation, the refractive indices of the respective members are as follows:

planarizing layer material: 1.55
silicon oxide ($SiO_2$): 1.47
silicon nitride ($Si_3N_4$): 2.0
silicon oxynitride (SiNO): 1.73
silicon (Si): 4.0

The height H2 of the light guide LG was assumed to have a variation in the range of 100 nm between all pixels, and parameters (the thicknesses of other members or film thicknesses) other than H1 and H2 were assumed to be constant (fixed values). In this case, according to the dependence of the RGB light sensitivity ratio variation SV on the lens height H1 of the inner lens $IL_R$ in FIG. 6B, the RGB light sensitivity ratio variation SV takes a small value near H1=485 nm. To the contrary, the RGB light sensitivity ratio variation SV takes a large value near H1=425 nm and H1=540 nm.

That is, if the lens height H1 of the inner lens $IL_R$ has a difference of about 60 to 70 nm between pixels, the RGB light sensitivity ratio variation SV greatly changes. Therefore, the variation of the lens height H1 of the inner lens $IL_R$ needs to be suppressed.

However, the variation of the etching amount of the inner lens member by etching is generally larger than the variation of the thickness or film thickness when the inner lens member is formed by deposition or the like. For this reason, the lens height H1 varies in the method of forming the inner lens $IL_R$ in the above-mentioned comparative example (see FIGS. 5B1 to 5B3).

In contrast, in the method of forming the inner lens IL according to the present invention, while leaving the upper face of a portion, above each photoelectric conversion portion PD, of the inner lens member ILi, the peripheral portion of this portion is removed, as shown in FIGS. 4A3 and 4A4. That is, the upper face of the inner lens member ILi of the portion above the photoelectric conversion portion PD is kept flat. In the above-described example, when the inner lens member ILi is etched by etching the resist pattern RM shaped into a lens shape, the etching ends so as to leave the part RM' of the resist pattern RM. After that, the remaining part RM' is removed, obtaining the inner lens IL having a flat upper face. According to this forming method, the height of the upper face of the inner lens IL is substantially equal to the height of the upper face of the inner lens member ILi at the time of formation. Hence, this forming method reduces the variation of the lens height of the inner lens IL, compared to the above-described comparative example.

Figure 7A:
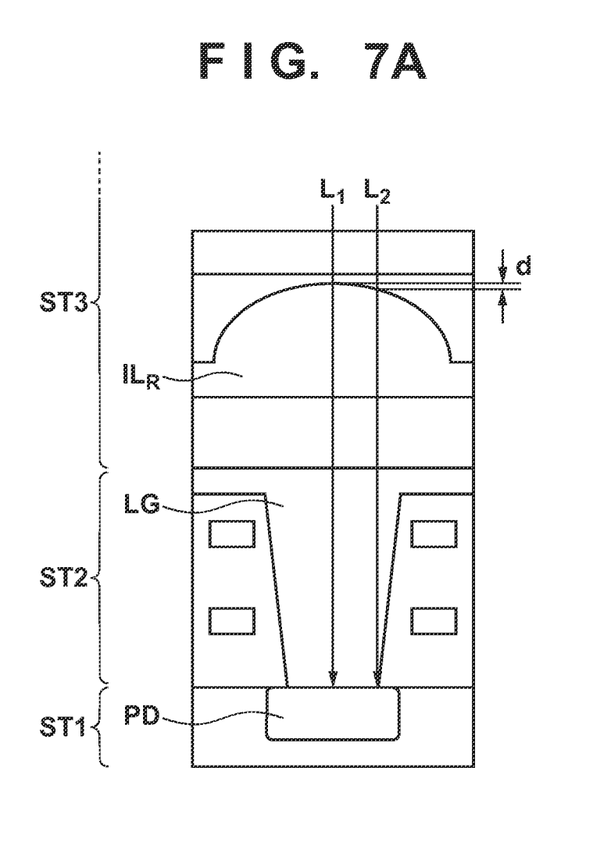
FIGS. 7A and 7B are views for explaining the dependence of the optical characteristic of the inner lens on the inner lens shape.
Figure 7B:
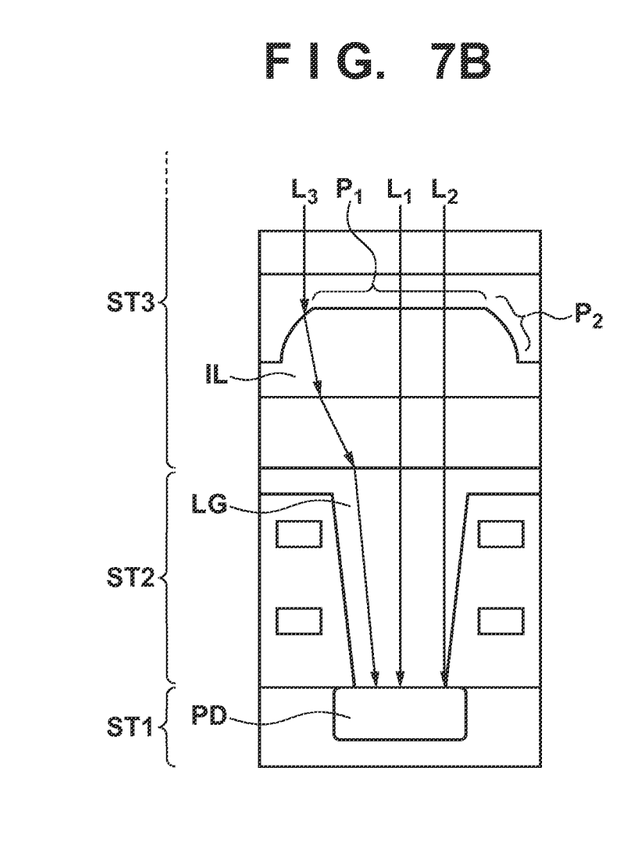

FIGS. 7A and 7B are schematic views for explaining the optical characteristic of the inner lens. FIG. 7A shows a case in which the inner lens has an arcuate shape (inner lens $IL_R$). FIG. 7B shows a case in which the top of the inner lens has a flat shape (inner lens IL).

In FIGS. 7A and 7B, light $L_1$ is light that passes through the microlens ML and enters the center of the inner lens $IL_R$, and light $L_2$ is light that enters an outer portion with respect to the light L. Assume that the light $L_1$ and light $L_2$ are light beams entering portions, close to each other, of the top of the inner lens $IL_R$, and the refraction of the light $L_1$ and light $L_2$ by the inner lens $IL_R$ is not taken into account.

In the case of FIG. 7A, the light $L_1$ and light $L_2$ have an optical path difference d owing to the curved face of the inner lens $IL_R$. Assuming that the optical system is designed to maximize the transmittance of the light $L_1$ to the photoelectric conversion portion PD on the optical path of the light $L_1$, the optical path length of the optical path of the light $L_2$ has the optical path difference d from the light $L_1$, the transmittance of the light $L_2$ to the photoelectric conversion portion PD decreases, and the light sensitivity may decrease.

In the case of FIG. 7B, a central portion $P_1$ of the inner lens IL has a flat upper face, so the optical path lengths of the light $L_1$ and light $L_2$ are substantially equal (the optical path difference d is not generated). Thus, the light sensitivity is improved in comparison with the case of FIG. 7A.

Light $L_3$ entering the peripheral portion $P_2$ around the central portion $P_1$ is refracted by the peripheral portion $P_2$ toward the light guide LG, and then guided to the photoelectric conversion portion PD through the light guide LG. The peripheral portion $P_2$ may be positioned inside with respect to the outer edge of the light guide LG or inside with respect to the outer edge of the photoelectric conversion portion PD. Of light entering the inner lens IL, light entering the central portion $P_1$ is directly guided to the light guide LG, and light entering the peripheral portion $P_2$ is effectively refracted toward the light guide LG.

Note that FIG. 7B exemplifies the shape of the inner lens IL having a curved face shape with a predetermined curvature at the peripheral portion $P_2$. However, the shape of the inner lens IL is not limited to this. For example, the inner lens IL may have a shape in which the peripheral portion $P_2$ has an inclined face at a predetermined inclination angle (that is, the sectional shape of the inner lens IL may be trapezoidal). For example, if the resist pattern RM has a conical shape, the outer shape of the inner lens IL when viewed from the top becomes circular, and the sectional shape of the inner lens IL becomes trapezoidal. For example, if the resist pattern RM has a polygonal pyramid shape, the outer shape of the inner lens IL when viewed from the top becomes polygonal, and the sectional shape of the inner lens IL becomes trapezoidal.

As described above, the present invention reduces the variation of the lens height of the inner lens IL, as a result, reduces the light sensitivity ratio variation between pixels, and improves the light sensitivity in each pixel.

It is desirable that planarization processing by CMP or the like is performed at least once in the steps until the inner lens member ILi is formed. This can further reduce the variation of the height of the upper face of the inner lens IL.

Although the structure having the light guide LG has been exemplified above, the present invention is applicable to even a structure having no light guide LG or a back-side illumination solid-state imaging apparatus. In a structure in which one inner lens is arranged for two or more photoelectric conversion portions, the flat portion of the inner lens is sometimes located at the boundary between the photoelectric conversion portion and the photoelectric conversion portion of an adjacent pixel. Even in this case, the present invention is applicable to this inner lens, and multiple reflection is thus reduced.

The present invention is not limited to the above aspect as a matter of course, and may be partially changed in accordance with the purpose, application, or the like without departing from the spirit and scope of the invention.

Imaging System

The above embodiment has described a solid-state imaging apparatus included in an imaging system represented by a camera or the like. The concept of the imaging system includes not only apparatuses primarily aiming at shooting but also apparatuses (for example, personal computer and portable terminal) secondarily having a shooting function. The imaging system can include the solid-state imaging apparatus according to the present invention exemplified as the above embodiment, and a signal processor that processes a signal output from the solid-state imaging apparatus. The signal processor can include, for example, an A/D converter, and a processor that processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-028965, filed Feb. 18, 2014, which is hereby incorporated by reference herein in its entirety.

What is claimed is:

1. A method of manufacturing a solid-state imaging apparatus, comprising:
    preparing a substrate on which a plurality of photoelectric conversion portions are arranged;
    forming, on the substrate, a dielectric film for forming a plurality of inner lenses corresponding to the plurality of photoelectric conversion portions;
    forming a plurality of members on the dielectric film, the plurality of members having one of a lens shape, a conical shape, and a polygonal pyramid shape;
    etching the plurality of members and the dielectric film to form the plurality of inner lenses, such that part of each member is left on a flat upper face of the dielectric film and part of the dielectric film around the part of each member that is left is remove; and
    forming, on the plurality of inner lenses, a plurality of microlenses corresponding to the plurality of photoelectric conversion portions.

2. The method according to claim 1, wherein, in the forming the dielectric film, the upper face of the dielectric film is formed by CVD.

3. The method according to claim 1, further comprising, after the etching the plurality of members and the dielectric film and before the forming the plurality of microlenses,
    removing the part of each member that is left on the flat upper face of the dielectric film without removing the dielectric film.

4. The method according to claim 3, wherein the plurality of members are formed from a thermoplastic material by forming a thermoplastic member on the dielectric film, patterning the thermoplastic member to form a patterned thermoplastic member, and then heating the patterned thermoplastic member.

5. The method according to claim 3, wherein the plurality of members are formed from a photosensitive material by forming a photosensitive member on the dielectric film, exposing the photosensitive member to form an exposed photosensitive member, and then developing the exposed photosensitive member.

6. The method according to claim 5, wherein the photosensitive member is exposed using a multi-tone photomask.

7. The method according to claim 1, wherein the plurality of members are
    a resist pattern.

8. The method according to claim 1, wherein the forming the plurality of microlenses includes:
    forming, on the plurality of inner lenses, a second dielectric film for forming the plurality of microlenses; and
    shaping the second dielectric film to form the plurality of microlenses, each of the plurality of microlenses having a flat upper face.

9. The method according to claim 1, further comprising, after the preparing the substrate and before the forming the dielectric film:
    forming, on the substrate, a structure including an insulating member and a wiring portion arranged in the insulating member; and
    forming light guides at portions corresponding to the photoelectric conversion portions in the structure.

10. The method according to claim 9, wherein, in the etching the plurality of members and the dielectric film, an outer edge of the part of each member that is left is inside with respect to an outer edge of a corresponding light guide.

11. The method according to claim 1, wherein, in the etching the plurality of members and the dielectric film, an outer edge of the part of each member that is left is inside with respect to an outer edge of a corresponding photoelectric conversion portion.

12. The method according to claim 1, wherein, in the etching the plurality of members and the dielectric film, curved faces or inclined faces of the dielectric film are formed around part of the flat upper face of the dielectric film covered by the part of the each member that is left, the curved faces or the inclined faces being connected to the part of the flat upper face.

* * * * *